United States Patent
Murakami

[19]

[11] Patent Number: 6,101,937
[45] Date of Patent: Aug. 15, 2000

[54] SCREEN PRINTING MACHINE HAVING PASTE DISPENSERS AND A SQUEEGEE UNIT

[75] Inventor: Takehiko Murakami, Tokyo, Japan

[73] Assignee: Minami Co., Ltd., Toko, Japan

[21] Appl. No.: 09/289,080

[22] Filed: Apr. 8, 1999

Related U.S. Application Data

[63] Continuation-in-part of application No. 09/022,286, Feb. 11, 1998, abandoned.

[30]        Foreign Application Priority Data

Feb. 12, 1997   [JP]   Japan ..................................... 9-41383

[51] Int. Cl.[7] .............................. B05C 11/04; B41F 15/46
[52] U.S. Cl. .......................... 101/123; 101/114; 118/301; 118/213
[58] Field of Search ..................................... 101/114, 123, 101/124, 129; 118/301, 406, 213; 427/282

[56]            References Cited

U.S. PATENT DOCUMENTS

| | | | |
|---|---|---|---|
| 4,193,344 | 3/1980 | Ericsson | 101/129 |
| 4,365,968 | 12/1982 | Gregorian et al. | 101/123 |
| 4,485,736 | 12/1984 | Strutz, Jr. et al. | 101/123 |
| 5,332,439 | 7/1994 | Watanabe et al. | 101/123 |
| 5,483,884 | 1/1996 | Vellanki | 101/123 |
| 5,947,022 | 9/1999 | Freeman et al. | 101/123 |
| 5,953,986 | 9/1999 | Murakami | 101/123 |

FOREIGN PATENT DOCUMENTS

| | | | |
|---|---|---|---|
| 56-84962 | 7/1981 | Japan | 101/123 |
| 4-107145 | 4/1992 | Japan | 101/123 |

*Primary Examiner*—Ren Yan
*Assistant Examiner*—Leslie J. Grohusky
*Attorney, Agent, or Firm*—Fish & Richardson P.C.

[57]            ABSTRACT

A dispenser for a surface mounting paste or the like comprises a substrate 12 and a plurality of nozzles 9, 10 and 11 attached thereto such that they can be vertically driven. The paste dispenser 8 is moved by means of a squeegee moving mechanism.

7 Claims, 6 Drawing Sheets

SCREEN PRINTING MACHINE HAVING PASTE DISPENSERS AND A SQUEEGEE UNIT

This is a continuation-in-part of my prior U.S. patent application Ser. No. 09/022,286, filed Feb. 11, 1998, now abandoned.

BACKGROUND OF THE INVENTION

The present invention relates generally to a screen printing machine, and more particularly to a screen printing machine designed to move a dispenser for surface mounting pastes or the like using a squeegee moving mechanism.

A conventional screen printing machine uses separate devices, one for printing and the other for coating a surface mounting paste or the like on a printed circuit board upon completion of printing.

For this reason, not only additional expenses but also and extra space is needed for such separate devices.

In view of the aforesaid problem, it is an object of the present invention to provide a screen printing machine wherein a dispenser for a surface mounting paste or the like is moved by means of a squeegee moving mechanism to incorporate it in the single screen printing machine.

SUMMARY OF THE INVENTION

According to the present invention, this object is accomplished by the provision of a screen printing machine where a dispenser for a surface mounting paste or the like is moved by means of a mechanism for moving a squeegee in a horizontal direction, the dispenser including a base plate and a nozzle attached thereto such that the nozzle can be vertically driven.

Preferably in the invention, a plurality of nozzles are used to dispense the surface mounting paste.

In general, the invention features a screen printing machine for distributing surface mounting paste evenly across a surface of a blank member to be printed.

In one aspect of the invention, the screen printing machine includes a machine frame for holding a member to be printed, a dispenser for dispensing a paste, and a squeegee unit where the squeegee unit and the dispenser are mounted on a common platform in a fixed spatial relationship with respect to each other. The screen printing machine further includes a moving mechanism movably supporting the platform and connected to the machine frame for moving the platform in a direction substantially parallel to a surface of the member to be printed. The dispenser and the squeegee unit are arranged to move in unison with each other. In particular, the squeegee unit moves to a non-operating position when the dispenser moves to an operating position above the member to be printed. When the squeegee unit moves to an operating position above the member to be printed, the dispenser moves to a non-operating position. The dispenser includes a plurality of nozzles, each mounted to be movable in a direction perpendicular to the surface of the member to be printed, independent of another nozzle.

In another aspect of the invention, a screen printing machine includes a machine frame holding a member to be printed, a dispenser for dispensing a paste on the member to be printed, a squeegee unit disposed in a fixed spatial relationship with respect to the dispenser, and a common platform on which at least one of the dispenser and the squeegee unit is mounted. The screen printing machine also includes a moving mechanism (e.g., an electric motor) which is arranged to drive the common platform to move at least one of the dispenser and the squeegee unit in a direction substantially parallel to a surface of the member to be printed during a printing process. The moving mechanism is arranged so that the dispenser and the squeegee unit are maintained in the fixed spatial relationship throughout the printing process. In particular, in a dispensing mode of operation, the dispenser is operable and the squeegee unit is non-operable, whereas in a squeegeeing mode of operation, the squeegee unit is operable and the dispenser is non-operable.

Screen printing machines with these arrangements offer numerous advantages. For example, because a single moving mechanism can move both the squeegee unit and the dispenser, the size of the machine as well as the cost of construction can be reduced. Furthermore, the squeegee unit and the dispenser maintain the fixed spatial relationship with respect to each other during a printing process.

Embodiments of either of the above aspects of the invention may include one or more of the following features.

The common platform includes a lead screw. Either or both of the squeegee unit and the dispenser include a threaded through-hole receiving the lead screw therethrough and having a thread pitch corresponding to a thread pitch of the lead screw. Both of the dispenser and the squeegee unit are mounted on the common platform.

The moving mechanism (e.g., a motor) is arranged to move at least one of the squeegee unit and the dispenser along a longitudinal axis of the common platform. The moving mechanism is mechanically coupled to the lead screw to rotate the lead screw.

The dispenser includes a plurality of nozzles. Each nozzle is arranged to be movable in a direction substantially perpendicular to a surface of the member to be printed, independent of another nozzle.

Other features and advantages of the invention will become apparent from the following detailed description, and from the claims.

DETAILED DESCRIPTION

Figure 1:
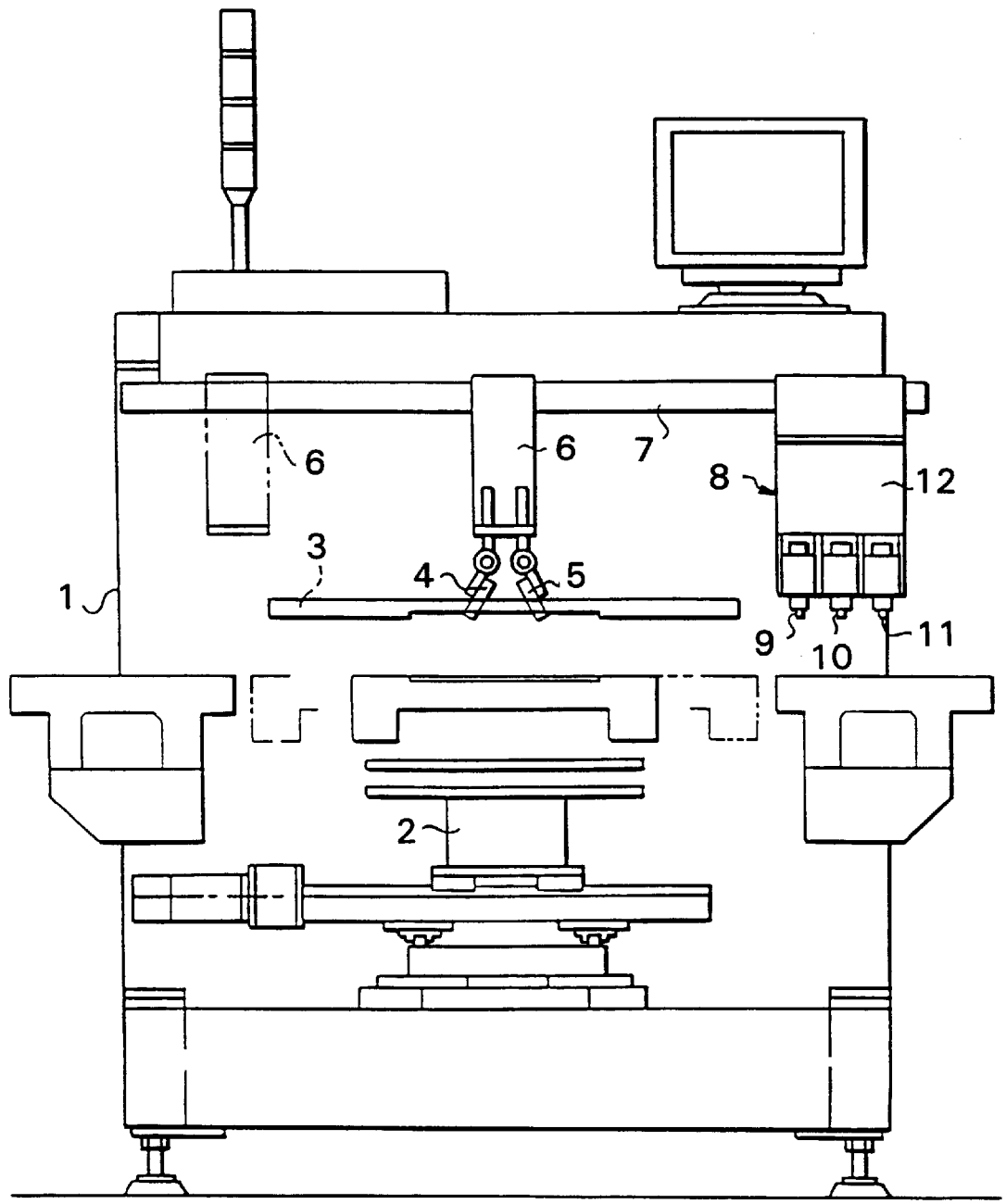
FIG. 1 is a front view of one embodiment of the invention.
Figure 2:
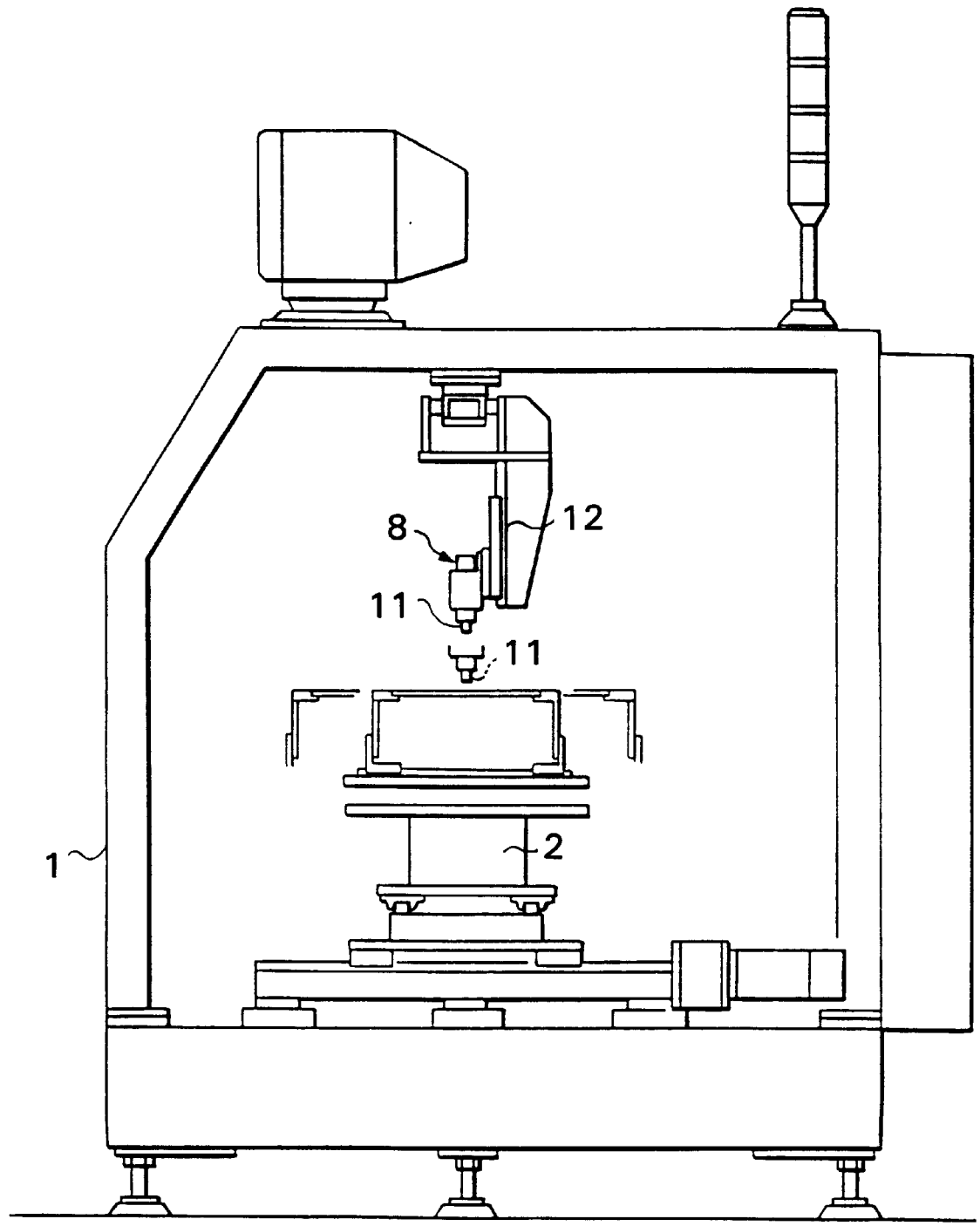
FIG. 2 is a side view of this embodiment.

One preferred embodiment of the invention will now be explained with reference to the accompanying drawings.

Throughout the drawings, reference numeral 1 stands for a screen printing machine body, 2 indicates a supporting unit for a blank member to be printed such as one for a printed circuit board, and 3 indicates a mask supporting stage.

Reference numerals 4 and 5 represent squeegees, 6 represents a squeegee supporting member, and 7 represents a squeegee moving mechanism.

A dispenser, especially a coater, for a surface mounting paste shown generally at 8 comprises a base plate 12 and three nozzles 9, 10 and 11 attached thereto such that they can be vertically driven. The nozzles 9, 10 and 11 are each designed to dispense the surface mounting paste. The paste dispenser 8 is movable by means of the squeegee moving mechanism 7.

Figure 3:
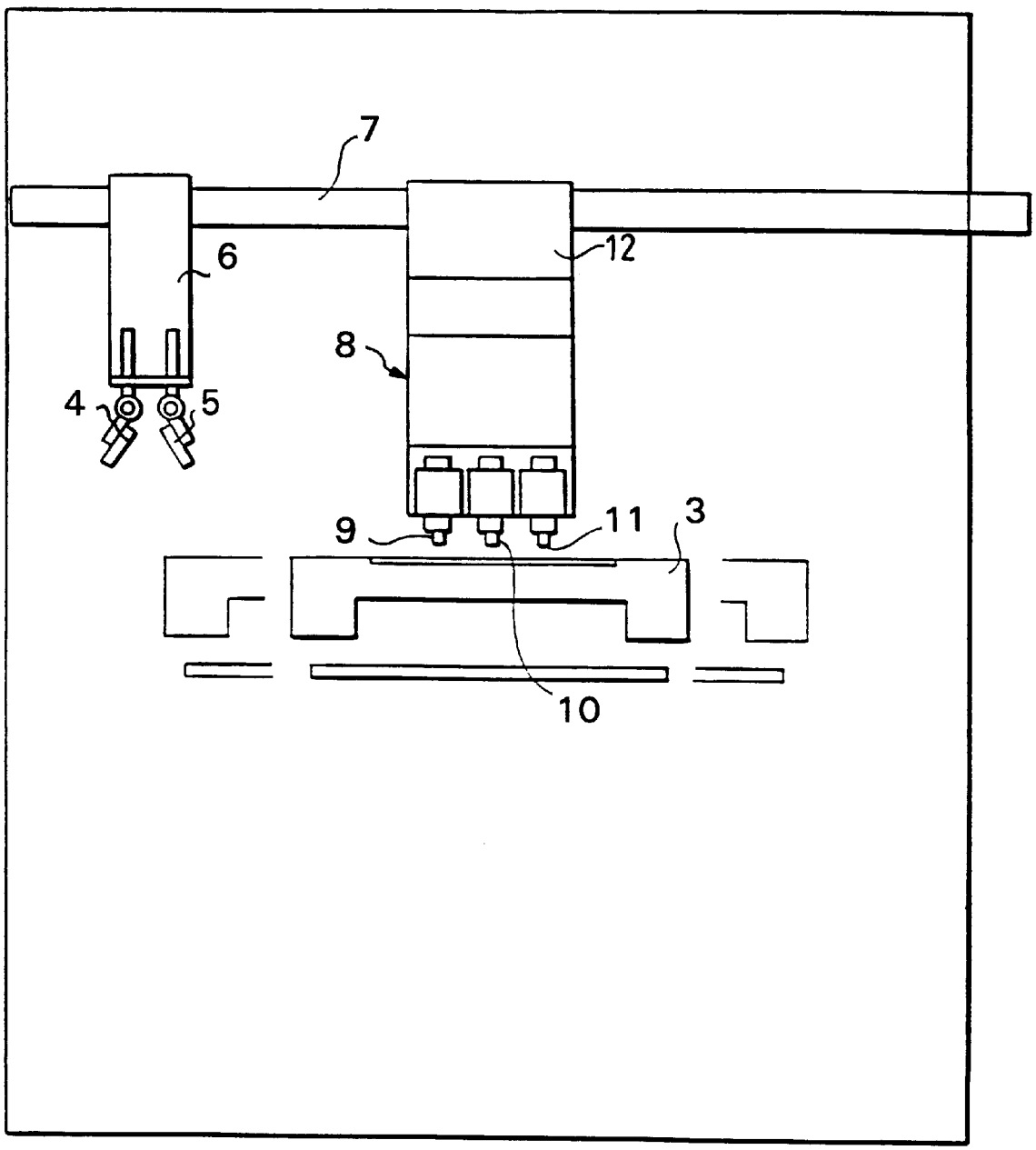
FIG. 3 is a view illustrative of how the embodiment of the invention works.

The paste dispenser 8 is moved onto the supporting unit 2 for supporting the blank member by means of the squeegee moving mechanism 7 as shown in FIG. 3, and moved back to the original position after the completion of coating operation. The moving mechanism 7 may be associated with both the paste dispenser 8 and the squeegees 4 and 5. In this case, the squeegees 4 and 5 are moved to their non-operating position simultaneously with the movement of the paste dispenser 8 to its operating position, and the paste dispenser is moved to its non-operating position simultaneously with the movement of the squeegees 4 and 5 to their operating position.

Thus, the squeegees are not in operation while the paste dispenser 8 is in operation, and the paste dispenser 8 is not in operation while the squeegees are in operation.

According to the present invention, a dispenser for a surface mounting paste or the like is designed to be moved by means of a squeegee moving mechanism, so that it can be incorporated in a single screen printing machine. Thus, some considerable cost reduction is achievable when compared with the provision of a separate dispenser for a surface mounting paste or the like. Mounting space savings, too, are achievable.

Figure 4:
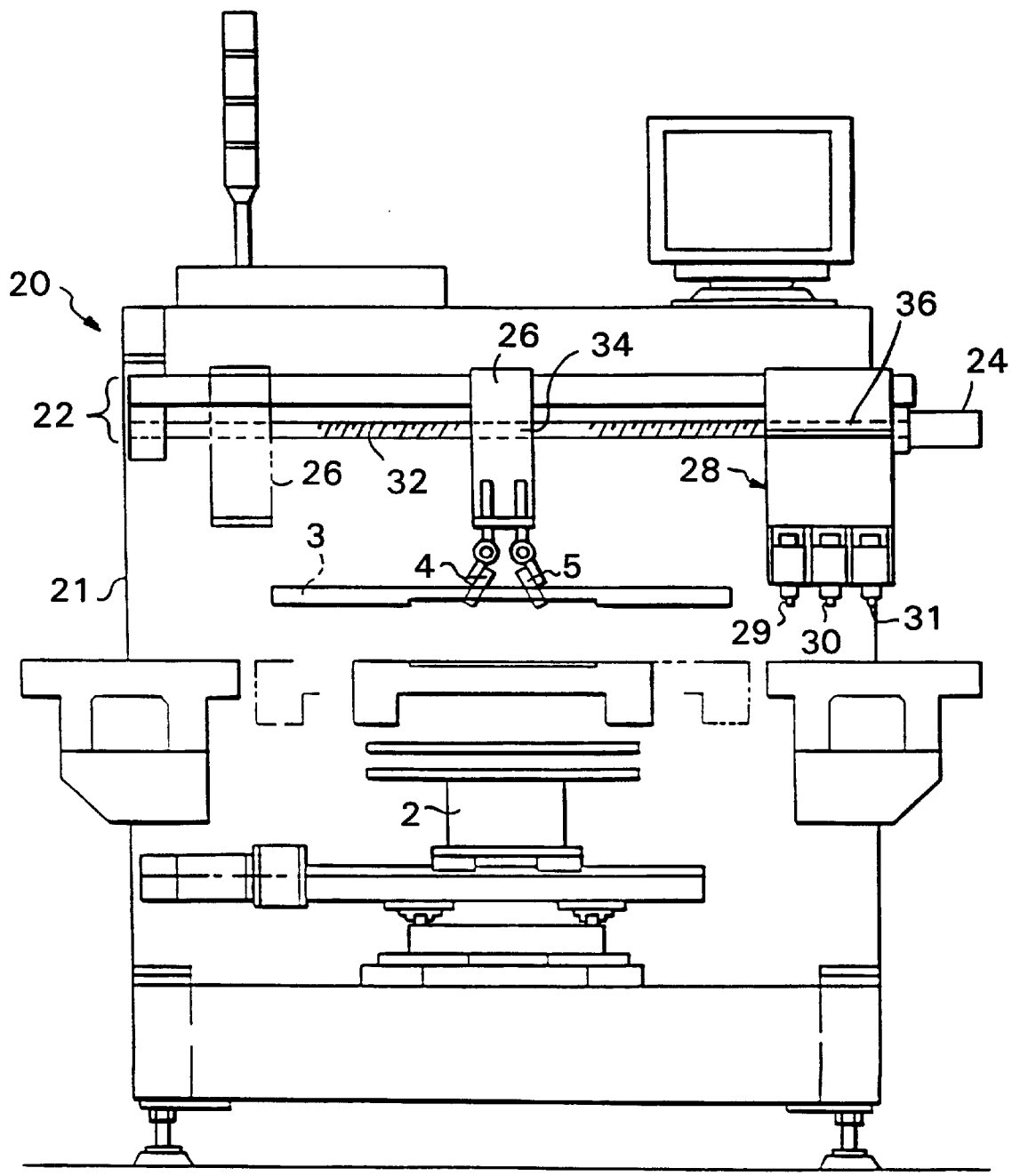
FIG. 4 is a front view of another embodiment of the invention including a squeegee unit and a dispenser coupled to a common platform.
Figure 5:
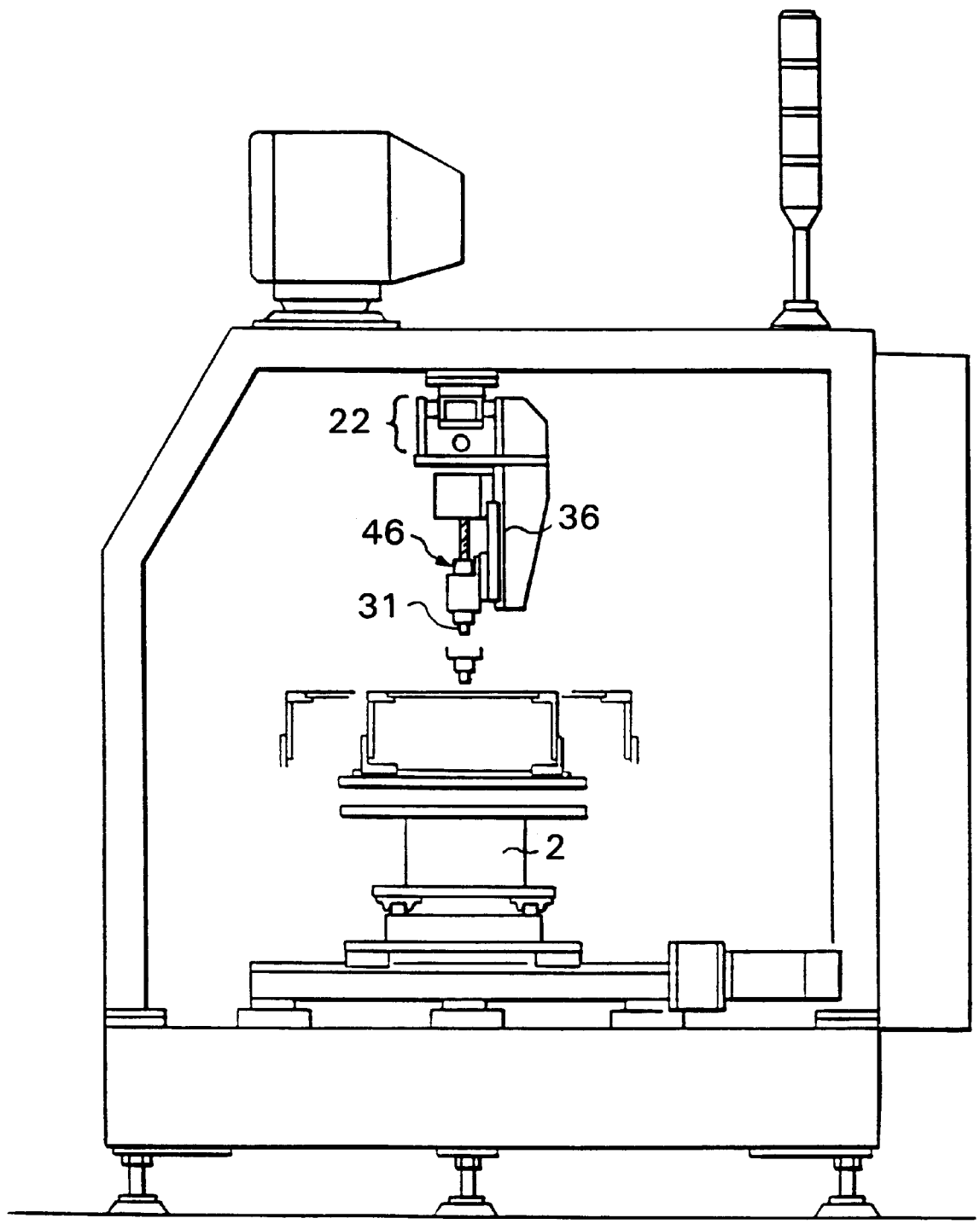
FIG. 5 is a side view of the embodiment of FIG. 4.
Figure 6:
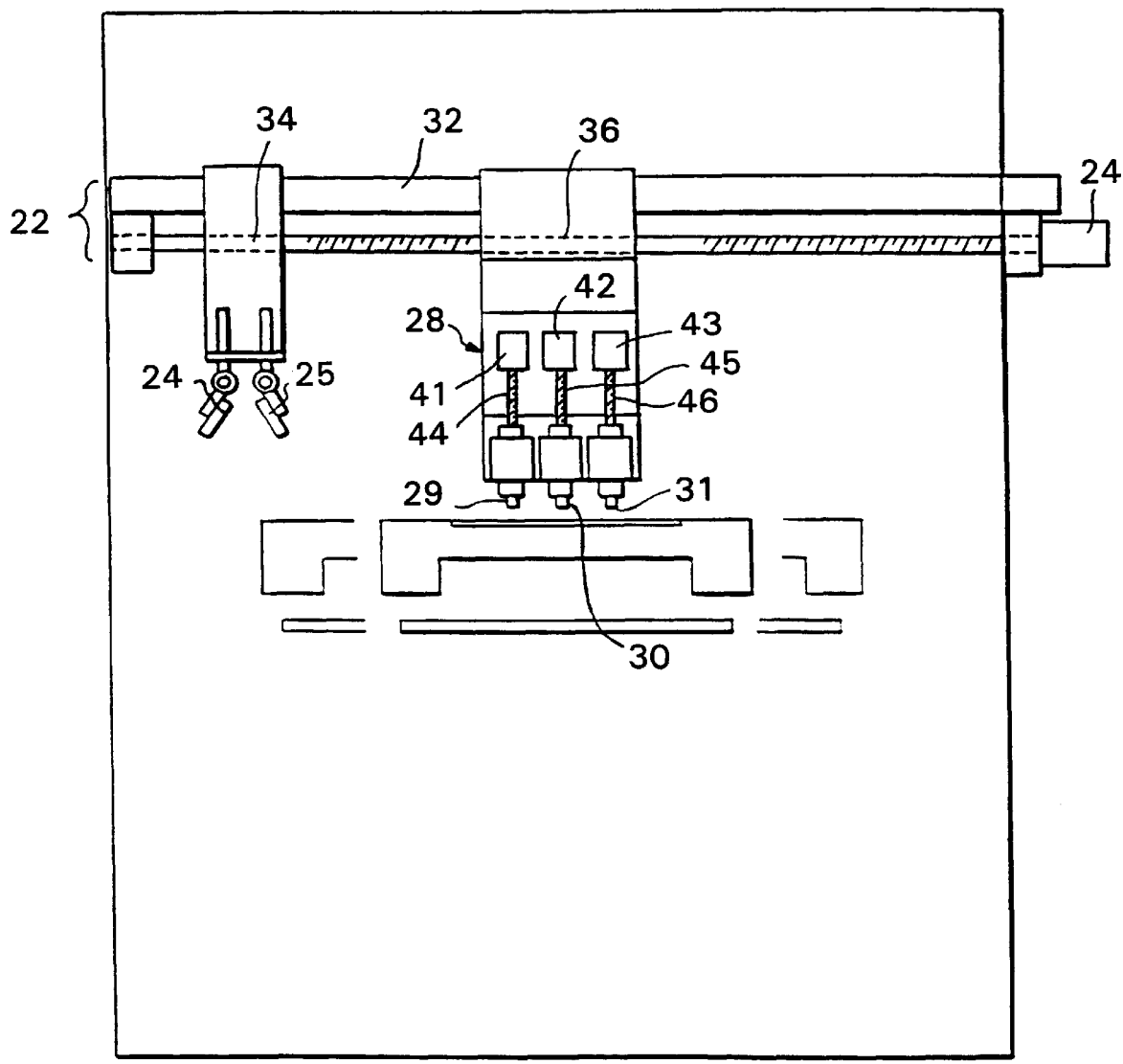
FIG. 6 is an exploded view of FIG. 4.

Referring to FIGS. 4 to 6, another embodiment of a screen printing machine 20 is shown. As was the case with screen printing machine 1, described above, screen printing machine 20 includes a machine body 21 having a support surface upon which a blank member (e.g., printed circuit board substrate) is placed for processing. Screen printing machine 20 also includes a squeegee unit 26 and a dispenser 28 both of which are mounted on a common platform 22 movable over the support surface of machine body 21 by a motor 24. Squeegee unit 26 and dispenser 28 are mounted on common platform 22 in a fixed spatial relationship with respect to each other. Furthermore, and as will be discussed below, common platform 22 and motor 24 cooperate to move squeegee unit 26 and dispenser 28 in unison with each other over the member to be printed in a manner that the fixed spatial relationship between the squeegee unit and the dispenser is maintained throughout the entire printing process.

Referring to FIG. 4, common platform 22 includes a lead screw 32 positioned such that its longitudinal axis is substantially parallel to the surface of the blank member to be printed. Lead screw 32 has a length extending substantially from one side of machine body 21 to an opposite side of the machine body. Motor 24 is mounted to machine body 21 and is mechanically coupled to an end of lead screw 32 so that when the motor 24 is activated, the lead screw rotates. In one embodiment, a rotating shaft (not shown) of motor 24 may be attached directly to an end of lead screw 32, while the other end of the lead screw is releasably coupled to common platform 22 or machine body 21 to allow the motor to rotate the lead screw. Alternatively, motor 24 and lead screw 32 may be indirectly coupled through a gear assembly (not shown).

Squeegee unit 26 and dispenser 28 include through-holes 34, 36, respectively, which are shaped and sized to receive lead screw 32 therethrough. Lead screw 32 is threaded over a substantial portion of its length and through-holes 34, 36 are correspondingly threaded so that the relative positions of squeegee unit 26 and dispenser 28 on the lead screw, as well as relative to each other, can be adjusted and then fixed. Through-holes 34, 36 have a uniform pitch corresponding to that of lead screw 32. Thus, rotational motion imparted by motor 24 is transformed into translational motion of squeegee unit 26 and dispenser 28 along the length of lead screw 32 and in a direction substantially parallel to the surface of the member to be printed.

As stated above, in operation, squeegee unit 26 and dispenser 28 are mounted on lead screw 32 in fixed spatial relationship with respect to each other. To assemble squeegee unit 26 and dispenser 28 on lead screw 32, one end of the lead screw is first placed through through-hole 34 of squeegee unit 26. Lead screw 32 is then rotated so that squeegee unit 26 moves along the threaded portion of the lead screw by a predetermined distance. Dispenser 28 is then mounted on lead screw 32 by placing the lead screw through through-hole 36 of the dispenser and further rotated to position the dispenser at the desired axial position along the lead screw. Although in this assembly procedure, squeegee unit 26 is positioned on lead screw 32 prior to placing dispenser 28, both units can be positioned on the lead screw in the reverse order as well.

Because squeegee unit 26, dispenser 28, and lead screw 32 have threads with an identical pitch, rotation of the lead screw translates the squeegee unit and the dispenser by the same distance along the threaded portion of the lead screw, while maintaining their fixed spatial relationship with respect to each other. Because a single moving mechanism can move both squeegee unit 26 and dispenser 28, this embodiment offers benefits of reducing the size as well as the cost of construction of screen printing machine 20.

Motor 24 is generally arranged to rotate lead screw 32 both in a clockwise and a counter-clockwise direction, allowing one of squeegee unit 26 and dispenser 28 to be positioned substantially over the blank member to be printed, while the other of the squeegee unit and the dispenser may not be positioned over the blank member.

Referring to FIGS. 5 and 6, dispenser 28 includes three nozzles 29, 30, 31, each of which is capable of dispensing surface mounting paste in the dispensing mode of the printing operation. Each nozzle 29, 30, 31 is mechanically connected to one end of a threaded screw 44, 45, 46, respectively. Each threaded screw 44, 45, 46 is positioned so that its longitudinal axis is substantially vertical to the surface of the member to be printed. The opposite end of threaded screw 44, 45, 46 is connected to a shaft of a motor 41, 42, 43, respectively. Thus, rotation of the motor shaft moves a corresponding nozzle 29, 30, 31 towards and away from the member to be printed in the vertical direction. It is noted that each motor 41, 42, 43 can vertically drive each nozzle 29, 30, 31 independent of other nozzles. Although multiple nozzles 29, 30, 31 of dispenser 28 illustrated in FIGS. 4 and 5 are arranged in a direction parallel to the longitudinal axis of lead screw 32, they may be arranged in another direction which is substantially perpendicular to the longitudinal axis of the lead screw.

Operation of screen printing machine 20 will now be described. In a dispensing mode of the printing operation, motor 24 rotates lead screw 32 in a direction to move dispenser 28 at a position over the blank member where surface mounting paste is desired to be applied onto the surface of the blank member. In this dispensing mode, squeegee unit 26 is not operative and, therefore, is not required to be positioned over the blank member. Once in position, one or more of motors 41, 42, 43 are activated to vertically drive a corresponding nozzle 29, 30, 31 so that the paste is appropriately applied.

At the completion of the dispensing mode, dispenser 28 completes dispensing the paste, lead screw 32 is rotated by motor 24 (e.g., in an opposite direction) so that squeegee unit 26 is moved over the area of the blank member previously occupied by dispenser 28. In this position, dispenser is not operative and, therefore, is not required to be positioned over the blank member. Motor 24 is further rotated to allow squeegees 4, 5 of squeegee unit 26 to sweep over a desired portion of the blank member to distribute the paste evenly across the surface of the blank member. The printed member is then replaced by a new member to be printed (not shown in the figures) and the above procedure is repeated.

Other embodiments are within the scope of the claims. The embodiment illustrated in FIGS. 4 through 6 include lead screw 32 threading through both squeegee unit 26 and dispenser 28. In an alternative embodiment, only squeegee unit 26 (or dispenser 28) may include a through-holes 34 (or 36) receiving lead screw 32 therethrough, while the dispenser (or the squeegee unit) is mechanically coupled to the squeegee unit (or the dispenser) by a predetermined distance through a mechanical connector. Accordingly, rotational motion of the motor shaft during a printing process translates squeegee unit 26 (or dispenser 28) along the length of the lead screw, while the squeegee unit (or the dispenser) moves the dispenser (or the squeegee unit) in unison with each other, thereby maintaining the fixed spatial relationship with respect to each other. In yet another embodiment, common platform 22 may include an endless chain or belt extending essentially from one side to an opposite side of machine body 21. Either or both of squeegee unit 26 and dispenser 28 may be coupled to the chain or belt by a predetermined distance. Motor 24 may be arranged to move the chain or belt, thereby translating squeegee unit 26 and dispenser 28 towards and away from the member to be printed while maintaining the fixed spatial relationship with respect to each other.

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A screen printing machine comprising:
    a machine frame for holding a member to be printed;
    a dispenser for dispensing a paste and comprising a plurality of nozzles;
    a squeegee unit, said squeegee unit and said dispenser mounted on a common platform in a fixed spatial relationship with respect to each other;
    a moving mechanism movably supporting said platform and connected to said machine frame for moving the platform in a direction substantially parallel to a surface of said member to be printed,
    wherein said dispenser and said squeegee unit move in unison with each other, wherein said squeegee unit moves to a non-operating position when said dispenser moves to an operating position above said member to be printed, wherein said squeegee unit moves to an operating position above said member to be printed when said dispenser moves to a non-operating position, and wherein each nozzle is mounted to be movable in a direction perpendicular to said surface of said member to be printed, independent of another nozzle.

2. A screen printing machine comprising:
    a machine frame for holding a member to be printed;
    a dispenser for dispensing a paste on said member to be printed;
    a squeegee unit disposed in a fixed spatial relationship with respect to said dispenser;
    a common platform on which at least one of said dispenser and said squeegee unit is mounted;
    a moving mechanism configured to drive said common platform to move at least one of said dispenser and said squeegee unit in a direction substantially parallel to a surface of said member to be printed during a printing process, said moving mechanism configured so that said dispenser and said squeegee unit are maintained in said fixed spatial relationship throughout said printing process,
    wherein, in a dispensing mode of operation, said dispenser being operable and said squeegee unit being non-operable and, in a squeegeeing mode of operation, said squeegee unit being operable and said dispenser being non-operable, said dispenser comprising a plurality of nozzles, wherein each nozzle is configured to be movable in a direction substantially perpendicular to a surface of said member to be printed, independent of another nozzle.

3. A screen printing machine according to claim 2, wherein said common platform includes a longitudinal axis and said moving mechanism is configured to move at least one of said squeegee unit and said dispenser along said longitudinal axis.

4. A screen printing machine according to claim 2, wherein said common platform includes a lead screw.

5. A screen printing machine according to claim 4, wherein at least one of said squeegee unit and said dispenser includes a threaded through-hole receiving said lead screw therethrough and having a thread pitch corresponding to a thread pitch of said lead screw.

6. A screen printing machine according to claim 5, wherein said moving mechanism is mechanically coupled to said lead screw to rotate said lead screw.

7. A screen printing machine comprising:
    a screen printing machine body;
    a supporting unit for a blank member to be printed;
    a mask supporting stage disposed above said supporting unit;
    a mechanism disposed above said mask supporting stage for moving an object in a horizontal direction;
    a dispenser for a surface mounting paste; and
    a squeegee;
    wherein said dispenser and said squeegee are mounted on said horizontally moving mechanism at a given distance spaced away from each other, said squeegee is moved in parallel with and in association with the movement of said dispenser to a non-operating position when said dispenser is moved to an operating position above said supporting unit, and said squeegee is moved in parallel with and in association with the movement of said dispenser to said operating position above said supporting unit when said dispenser is moved to a non-operating position, wherein said dispenser for a surface mounting paste includes a plurality of nozzles each mounted on a base plate slidably in a vertical direction independent of each other.

* * * * *